United States Patent
Tenbrink et al.

(10) Patent No.: US 8,709,961 B2
(45) Date of Patent: Apr. 29, 2014

(54) METHOD FOR SUPERCONDUCTING CONNECTION BETWEEN MGB2 SUPERCONDUCTING WIRES VIA A MGB2 MATRIX MADE FROM A BORON POWDER COMPRESSED ELEMENT INFILTRATED WITH MG

(75) Inventors: Felicitas Tenbrink, Moembris (DE); André Aubele, Hanau (DE); Volker Gluecklich, Hammersbach (DE); Bernd Sailer, Alzenau (DE); Klaus Schlenga, Linkenheim (DE)

(73) Assignee: Bruker EAS GmbH, Hanau (DE)

( * ) Notice: Subject to any disclaimer, the term of this patent is extended or adjusted under 35 U.S.C. 154(b) by 531 days.

(21) Appl. No.: 12/656,870

(22) Filed: Feb. 18, 2010

(65) Prior Publication Data
US 2010/0216647 A1   Aug. 26, 2010

(30) Foreign Application Priority Data
Feb. 21, 2009 (DE) .......... 10 2009 010 112

(51) Int. Cl.
*C04B 35/04* (2006.01)

(52) U.S. Cl.
USPC ......... 501/108; 501/96.1; 501/96.3; 505/925; 505/926; 29/599

(58) Field of Classification Search
USPC .......... 501/96.1, 96.3, 108; 505/925, 926; 29/599
See application file for complete search history.

(56) References Cited

U.S. PATENT DOCUMENTS

| | | | |
|---|---|---|---|
| 4,744,506 A | 5/1988 | Thornton | |
| 5,308,831 A | 5/1994 | Fevrier | |
| 6,921,865 B2 | 7/2005 | Morita | |
| 7,226,894 B2 | 6/2007 | Raber | |
| 7,396,506 B2 | 7/2008 | Giunchi | |
| 2005/0090403 A1* | 4/2005 | Raber et al. | 505/100 |
| 2008/0236869 A1* | 10/2008 | Marte et al. | 174/125.1 |
| 2009/0105079 A1 | 4/2009 | Leghissa | |

FOREIGN PATENT DOCUMENTS

| | | | | |
|---|---|---|---|---|
| EP | 1276171 | * | 1/2003 | ............ H01R 4/68 |
| GB | 2 448 051 | | 10/2008 | |

OTHER PUBLICATIONS

Li, X. H. et al., "High critical current joint of MgB2 tapes using Mg and B powder mixture as flux", Superconductor Science and Technology, IOP Publishing, Techno House, Bristol, GB, vol. 21, Nr. 2, Feb. 1, 2008, Pa. 25017/1-25017/5.

(Continued)

*Primary Examiner* — Paul Wartalowicz
(74) *Attorney, Agent, or Firm* — Paul Vincent

(57) ABSTRACT

A method for superconductingly connecting two or more wires (1, 2), each comprising at least one filament (3a-3d) that contains $MgB_2$ or a mixture of Mg and B, wherein a superconducting connection is realized through exposed end regions (4a) of the filaments (3a-3d) via an $MgB_2$ matrix, is characterized in that a bulk boron powder (4) is provided into which the exposed end regions (4a) of the filaments (3a-3d) of the wires (1, 2) project, the boron of the bulk boron powder (4) being present in amorphous modification. The bulk powder (4) is then compacted together with the projecting exposed end regions (4a) of the filaments (3a, 3b) to form a compressed element (8) and the compressed element (8) is infiltrated with molten magnesium (10) from the surface (13) of the compressed element (8). The method improves the quality, in particular, the current-carrying capacity and the critical magnetic field strength of a superconducting connection of $MgB_2$ superconducting wires.

15 Claims, 6 Drawing Sheets

(56) References Cited

OTHER PUBLICATIONS

Giunchi, G. et al., "The reactive liquid Mg infiltration process to produce large superconducting bulk MgB2 manufacts", Cryogenics, Elsevier, Kidlington, GB LNKD-DOI:10.1016/J. Cryogenics.2005.11.011, vol. 46, Nr. 2-3, Feb. 1, 2006, Pa. 237-242.

Giunchi, G. et al., "Superconducting Joints between MgB2 Wires and Bulks", IEEE Transactions on Applied Superconductivity, vol. 20, Nr. 3, Jun. 1, 2010, Pa. 1524-1527.

\* cited by examiner

METHOD FOR SUPERCONDUCTING CONNECTION BETWEEN MGB2 SUPERCONDUCTING WIRES VIA A MGB2 MATRIX MADE FROM A BORON POWDER COMPRESSED ELEMENT INFILTRATED WITH MG

This application claims Paris Convention priority of DE 10 2009 010 112.8 filed Feb. 21, 2009 the complete disclosure of which is hereby incorporated by reference.

BACKGROUND OF THE INVENTION

The invention concerns a method for superconductingly connecting two or more wires, each comprising at least one filament that contains $MgB_2$ or a mixture of Mg and B, wherein the superconducting connection is realized by exposed end regions of the filaments via an $MgB_2$ matrix.

A method of this type is disclosed in U.S. Pat. No. 7,226,894 B2.

Superconducting wires, through which an electric current can flow without loss, are used in a plurality of ways, in particular, for high-field magnet coils. Superconducting materials thereby become superconducting only below a material-specific transition temperature $T_C$ such that superconducting materials must be cooled for technical use. One of the most important superconducting materials in the technical field is NbTi which has a transition temperature of approximately 10K. Since this low transition temperature requires cooling with cryogenic helium (boiling point approximately 4K), NbTi is relatively expensive to use.

In 2001, superconductivity was discovered in the Mg—B system, which enables relatively inexpensive cooling without cryogenic helium with a transition temperature of approximately 39K for $MgB_2$. For this reason, the operating costs of technical systems could be reduced and the ease of maintenance be increased. $MgB_2$ also has a higher critical magnetic field Bc2 compared to NbTi. For this reason, the superconducting system $MgB_2$ is currently the subject of numerous research and development activities.

EP 1 390 992 B1 (DE 602 13 688 T2) describes a method for producing $MgB_2$, wherein a porous preform is produced from mechanically activated crystalline boron powder. The preform is heated together with metallic magnesium in a container under inert conditions. Liquid magnesium thereby flows through the porous preform and reacts to form $MgB_2$.

One difficulty with the technical use of the $MgB_2$ superconducting system is the provision of superconducting connecting points ("joints"), in particular, between two $MgB_2$ superconducting wires. The quality of the superconducting connecting points thereby delimits the efficiency of the overall superconducting system.

U.S. Pat. No. 6,921,865 B2 discloses a joint of two superconducting wires, wherein exposed NbTi filaments of the superconducting wires project into bulk $MgB_2$ powder and are compressed therewith.

U.S. Pat. No. 7,226,894 B2 discloses a connection between two $MgB_2$ superconducting wires, wherein the $MgB_2$ filaments are exposed at the ends of two superconducting wires and are overlapped. The exposed ends are then heated together with a mixture of boron powder and magnesium powder, wherein boron and magnesium react to form $MgB_2$. The generated $MgB_2$ superconductingly connects the two wires. The generated $MgB_2$ is, however, highly porous and the resulting current-carrying capacity of the joint is relatively small.

DE 10 2006 020 829 A1 describes a superconductor connection between superconducting wire leads which can, e.g. be made from $MgB_2$. The freed ends of the wire leads are thereby disposed in a bushing containing $MgB_2$ bulk powder. The bulk powder is subsequently pressed together with the bushing.

It is the underlying purpose of the invention to improve the quality, in particular, the current-carrying capacity and critical magnetic field strength of a superconducting connection of $MgB_2$ superconducting wires.

SUMMARY OF THE INVENTION

This object is achieved by a method of the above-mentioned type, which is characterized in that
a) bulk boron powder is provided, into which the exposed end regions of the filaments of the wires project,
b) the bulk powder is compacted together with the projecting exposed end regions of the filaments to form a compressed element,
c) and the compressed element is infiltrated by molten magnesium starting from the surface of the compressed element.

The inventive method produces a very tight $MgB_2$ cover around the exposed (i.e. with their non-superconducting cover being removed) end regions of the filaments of the wires with magnesium diboride ($MgB_2$). The bulk boron powder is compressed (mechanically compacted) with the projecting end regions. Pressing is thereby performed on the powdery elemental boron, which is easy to process in a pressing method. A chemical reaction is not yet required during pressing. The exposed end regions of the superconducting wires are then fixed in the compressed element.

The compressed element is subsequently infiltrated by liquid magnesium (molten Mg) through its outer surfaces and reacts to form $MgB_2$. The porosity of the compressed element is thereby maintained, since the volume taken up by the boron powder corresponds fairly accurately to the volume of the $MgB_2$ obtained from this boron powder. The desired final porosity in the $MgB_2$ joint can therefore be adjusted via the compressed element. The porosity of the compressed element does, in particular, not increase by the reaction of the magnesium pouring in from outside of the compressed element with the boron frame of the compressed element (different than in the reaction of a mixture of magnesium powder and boron powder, wherein the magnesium powder produces additional porosity after reaction to form $MgB_2$).

A highly compacted compressed element, which is easy to produce from the bulk boron powder using simple conventional pressing methods, can thereby also produce a high-density $MgB_2$ joint. A dense $MgB_2$ element of the joint provides well-defined superconducting current-carrying paths in the joint and therefore high current-carrying capacity of the joint.

The invention also concerns the production of a monolithic $MgB_2$ element which is in contact with all wires to be connected (or their filaments) and is generated during the connecting process of the wires. The contained $MgB_2$ element of the compressed element bridges the space between the exposed end regions of the filaments of the different wires.

The bulk boron powder does not contain considerable amounts of Mg (Mg content below 5% with respect to amount of substance, preferably below 1%, preferentially magnesium-free). Pure boron powder is typically used as the bulk powder. Compression of the bulk powder generally requires no temperature control. Suitable pressing methods are, in particular, uniaxial pressing and isostatic pressing, in particular cold isostatic pressing (CIP).

In accordance with the invention, the compressed element is kept in contact with the molten Mg for a sufficient period of time until it is completely permeated with liquid magnesium ("infiltration time"), typically for some minutes and up to approximately one hour, depending on the temperature of the molten mass (which influences the viscosity), the compressed element geometry (which influences the length of the infiltration paths) and the porosity of the compressed element (which also influences the wetting behavior).

Infiltration starts a chemical reaction of B with Mg to form $MgB_2$. The temperature of the molten mass is thereby generally 650 to 750° C. The compressed element is typically heated by the molten Mg until the overall boron of the compressed element has reacted completely to form $MgB_2$ ("reaction time"). It is, however, also possible to provide an additional separate tempering step for the complete reaction after infiltration of the molten magnesium.

The porosity of the obtained $MgB_2$ frame on the joint can moreover be filled with Mg metal, which improves the stability of the joint.

The filaments of the wires may contain $MgB_2$ or still unreacted Mg and B. In case the filaments contain Mg and B, they are reacted to form $MgB_2$ after production of the joint through temperature treatment.

The invention provides in total a simple and inexpensive method for producing high-quality joints for connecting $MgB_2$ superconducting wires, which can be technically realized without problems as a standard industrial procedure.

In one preferred variant of the inventive method, the boron of the bulk boron powder is present in the form of an amorphous modification. The reaction of B with liquid Mg to form $MgB_2$ is realized in a particularly rapid and efficient fashion with amorphous boron.

In a particularly preferred method variant, the following applies for the amounts of substances n(Mg) of magnesium in the molten magnesium and n(B) of boron in the compressed element: $n(Mg)/n(B) \geq 0.5$. In other words, magnesium is used in the stoichiometrically required ratio or (preferably) in excessive amounts. This ensures complete reaction of the boron frame. When magnesium is used in a sufficiently excessive amount, the original porosity of the compressed element can additionally be filled with Mg metal.

In one method variant, the compressed element is immersed into the molten Mg in step c), wherein the molten Mg is provided in a pot. An immersion method is particularly easy to perform.

In an alternative method variant, the compressed element is disposed in a pot for step c) and the pot is subsequently filled with the molten Mg. Filling the pot with molten Mg may thereby be realized by pouring liquid molten Mg into the pot or also through melting solid Mg in the pot while the pressing element is present in the pot. The latter is particularly safe to perform, in particular when the pot is permanently closed at high temperatures. Solid magnesium provided in the pot may e.g. be in the form of a bar or granulated matter.

In one advantageous further development, the pot or a coating of the pot is produced from a material that is inert with respect to liquid magnesium, in particular, wherein this material comprises Nb, Ta, V, Ti or Fe. The inert pot prevents impurities of $MgB_2$ and thereby contributes to a high current-carrying capacity of the formed Mg $B_2$. The pot is typically heated, e.g. electrically heated, during the infiltration or reaction time.

In one preferred method variant, the compressed element is completely surrounded by the molten Mg in step c). This achieves uniform penetration of the compressed element of the bulk boron powder with molten Mg from all sides.

One preferred method variant is characterized in that the compressed element is covered at least partially by solid Mg, and in that in step c) the covered compressed element is heated beyond the melting temperature of magnesium. The cover realizes uniform permeation, in particular from several sides, of the compressed element with molten Mg even when a small amount of Mg material is used. The melting temperature of Mg, which must be reached in step c), is approximately 648.8° C. It must be noted that, when the magnesium contains additional components, the melting temperature can change (in particular drop). The cover may e.g. be an Mg foil, Mg sheet metal or outer coatings, and is preferably designed as a complete cover (provided on all sides). The cover should preferably be melted in a pot (which is preferably inert with respect to liquid magnesium and is typically heated). The thermal input into the cover can be realized, in particular, through thermal radiation.

In one particularly preferred method variant, the compressed element is compacted in step b) to at least 40%, preferably at least 50%, of the theoretical density. In other words, the porosity is less than 60%, preferably less than 50%. This yields a particularly dense $MgB_2$ material in the joint and thereby a particularly high current-carrying capacity. With particular preference, the compressed element is compacted to at least 55% of the theoretical density. In accordance with the invention, a residual porosity in the compressed element remains, which is sufficient for rapid pressure-less infiltration of the overall compressed element with molten magnesium.

Step c) is advantageously performed in a reducing or inert atmosphere, in particular, in an argon atmosphere. This prevents impurities (e.g. with oxygen due to the chemical reactions) of the $MgB_2$.

In one preferred method variant, the exposed end regions of the filaments of the different wires are disposed in the bulk powder in such a fashion that they abut each other, in particular, are interwoven with each other. This reduces the danger of badly conducting transitions between the filaments of the different wires, and the space between the filaments of different wires is minimized. Mutual abutment of the wires can be ensured in a simple fashion by twisting them together. Twisting together is realized in the simplest fashion as long as the filaments still have their metallic plasticity (i.e. prior to conversion into $MgB_2$).

In one particularly preferred method variant, the D50 grain size of the boron powder $\leq 1$ μm. This yields a particularly dense $MgB_2$ material on the joint.

The present invention also concerns a superconducting joint of two or more wires, each comprising at least one filament that contains $MgB_2$, produced in accordance with an inventive method. The inventive joint improves the current-carrying capacity.

Further advantages of the invention can be extracted from the description and the drawing. In accordance with the invention, the features mentioned above and below may be used individually or collectively in arbitrary combination. The embodiments shown and described are not to be understood as an exhaustive enumeration but have exemplary character for describing the invention.

The invention is illustrated in the drawing and is explained in more detail with reference to embodiments.

DESCRIPTION OF THE PREFERRED EMBODIMENT

Figure 1:
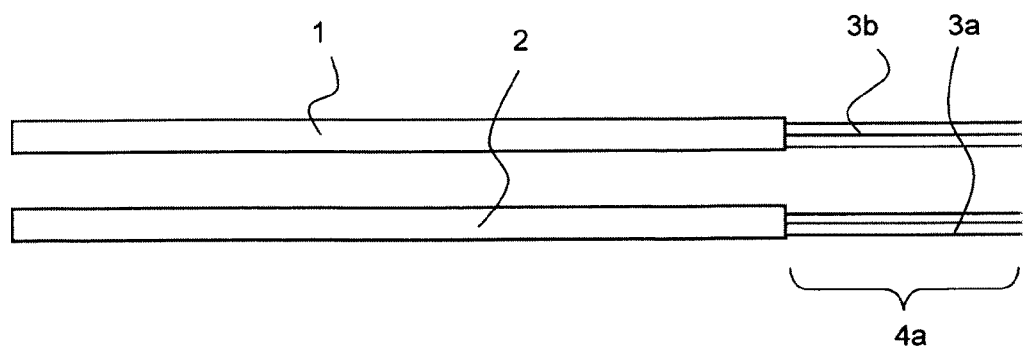
FIG. 1 shows a schematic view of wires which are to be superconductingly connected in accordance with the inventive method.

FIG. 1 shows two superconducting wires 1, 2, each comprising several filaments 3a, 3b that contain $MgB_2$. It should be noted that, within the scope of the invention, fully processed wires (containing $MgB_2$ filaments, principle "react and wind" for ready use in application systems) or also partially processed wires (containing filaments with unreacted or partially reacted Mg and B, principle "wind and react") can be used in dependence on the wire production technology and application systems.

Each filament 3a, 3b is exposed in one end region 4a (in FIG. 1 on the right-hand side). Towards this end, a coating of Monel, Fe, Nb, Ta, Ti, stainless steel, Ni, Cu or Cu alloy has been removed in the end region 4a of the illustrated wires 1, 2, e.g. through etching (exposure may also be realized by other chemical and/or mechanical methods, e.g. grinding or abrasion; it is thereby not absolutely necessary to remove all coatings). The filaments 3a,3b of the two wires 1, 2 shall be superconductingly connected in accordance with the invention (cf. FIGS. 3a to 6). Towards this end, the filaments 3a, 3b of the various wires 1, 2, should be brought into close proximity to each other.

Figure 2:
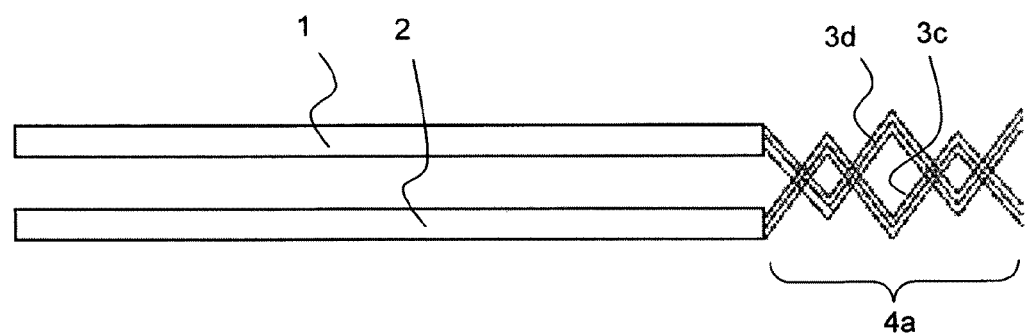
FIG. 2 shows a schematic view of wires which are to be superconductingly connected in accordance with the inventive method, with twisted together filaments.

FIG. 2 shows, similarly to FIG. 1, two superconducting wires 1, 2, each also comprising several filaments 3c, 3d, which are exposed in an end region 4a and are intended to be superconductingly connected in accordance with the invention (cf. FIGS. 3a to 6). In order to improve the electrical conductivity between the wires 1, 2, in the joint to be produced, the filaments 3c, 3d of the two wires 1, 2 were twisted together as a preparatory action.

Figure 3A:
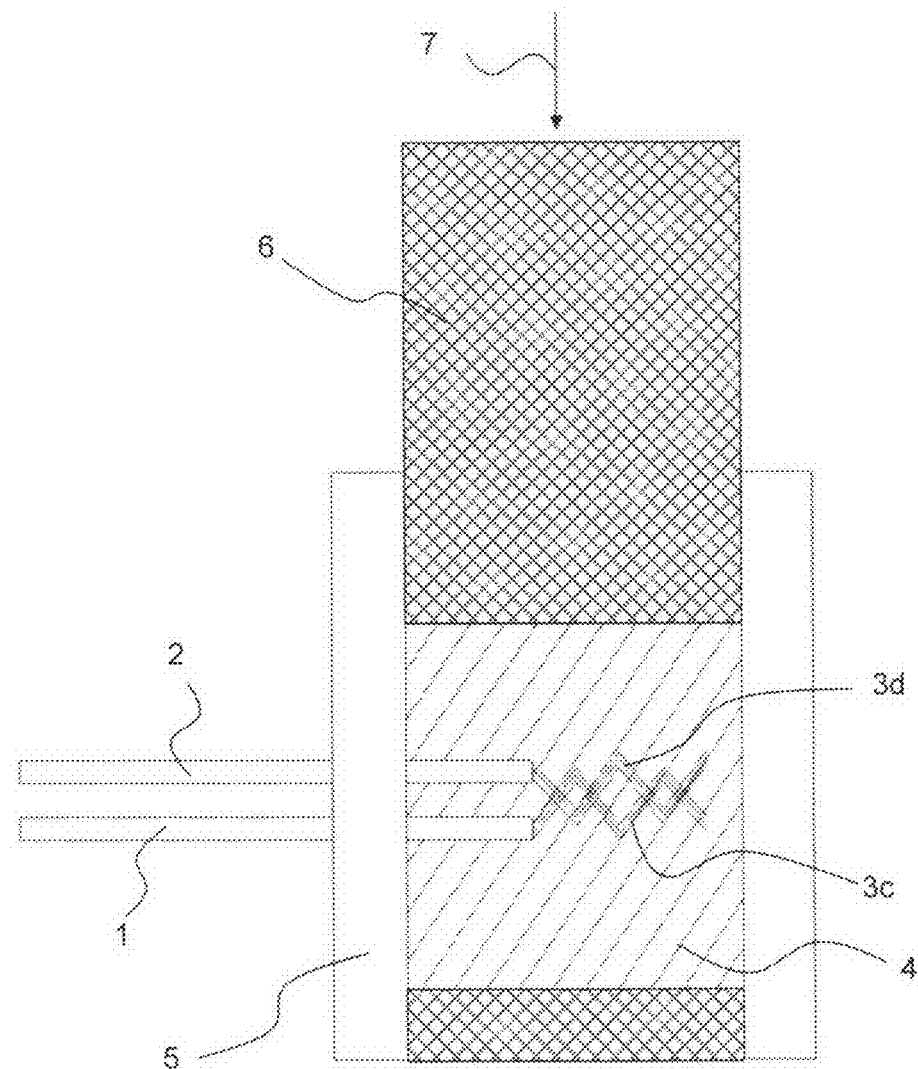
FIGS. 3a, 3b show schematic cross-sectional views of a pressing means for compacting bulk boron powder in accordance with the invention, with projecting, exposed filaments of two wires prior to compression (FIG. 3a), and after compression (FIG. 3b)
Figure 3B:
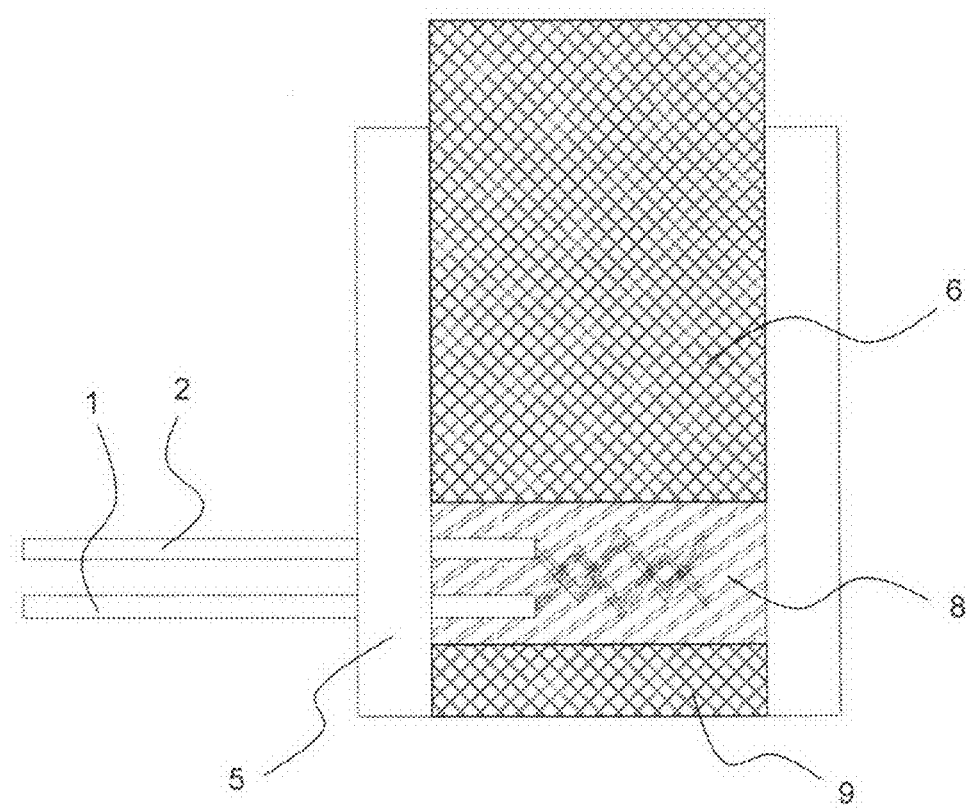

FIGS. 3a and 3b illustrate the inventive production of a boron powder compressed element between and around the ends of the two wires 1, 2.

As is illustrated in FIG. 3a, the exposed end regions of the filaments 3c, 3d of the wires 1, 2 are twisted together and project into the bulk powder 4. The bulk powder fills, in particular, the gaps between the exposed filaments 3c, 3d of the various wires 1, 2. The bulk powder 4 substantially consists of fine-grained boron powder, if necessary, auxiliary materials (e.g. waxes or oils for improving the pressing behavior, or binding agents to improve the solidity of the green body) are also contained. The bulk powder 4 is provided in a pressing mold 5 having an opening in its side wall for the two wires 1, 2.

The bulk powder 4 can be mechanically compacted by lowering a pressing ram 6 onto the bulk powder 4 in the direction of arrow 7. The pressing ram 6 is typically lowered by a hydraulic or mechanical mechanism providing a force. In the present example, the pressing process is performed without temperature control and furthermore does not require any protective gas conditions.

FIG. 3b shows the compressed element (also called green body) 8 after compacting the bulk powder. The pressing ram 6 has been introduced as far as possible into the pressing mold 5. After removal of the pressing ram 6 (and in most cases also of the pressing mold bottom 9), the compressed element 8 can be easily removed.

Figure 4:
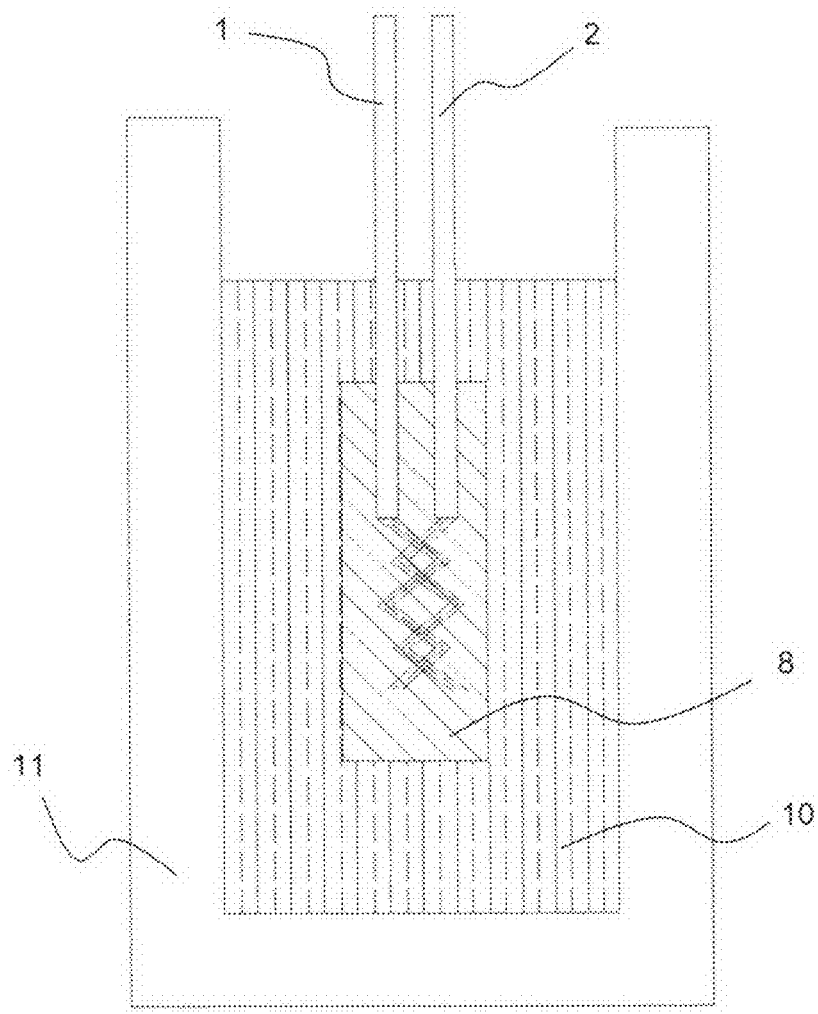
FIG. 4 shows a schematic view of a pot with molten Mg into which a compressed element is completely immersed for infiltration with molten Mg in accordance with the invention.

FIG. 4 illustrates a preferred type of infiltration of the compressed element 8 with molten magnesium 10. Molten magnesium 10 is filled in a protective gas atmosphere into a pot 11, which is produced from a material that is inert with respect to liquid magnesium, boron and MgB compounds, such as niobium, tantalum, vanadium, titanium or ferrite. The pot 11 is heated to keep the molten Mg 10 in a liquid aggregate state. The compressed element 8 is completely immersed into the molten Mg 10 such that liquid magnesium can penetrate into the compressed element 8 from all sides. The residual porosity of the compressed element 8 is thereby infiltrated. Residual porosities of typical pressing methods are normally sufficient to ensure satisfactory infiltration.

The infiltrated liquid Mg reacts with the boron base frame of the compressed element 8 to form $MgB_2$, wherein the volume of the base frame remains. The compressed element 8 is left in the molten magnesium 10 for a sufficiently long time to yield complete penetration of the molten magnesium 10 as well as complete reaction of the boron into $MgB_2$. The reacted compressed element 8 is subsequently removed from the molten Mg 10. The remaining magnesium solidifies in the pores of the compressed element 8 that consists now substantially of $MgB_2$.

The reacted compressed element 8 can be used as a higher power superconducting joint for the two wires 1, 2.

Figure 5:
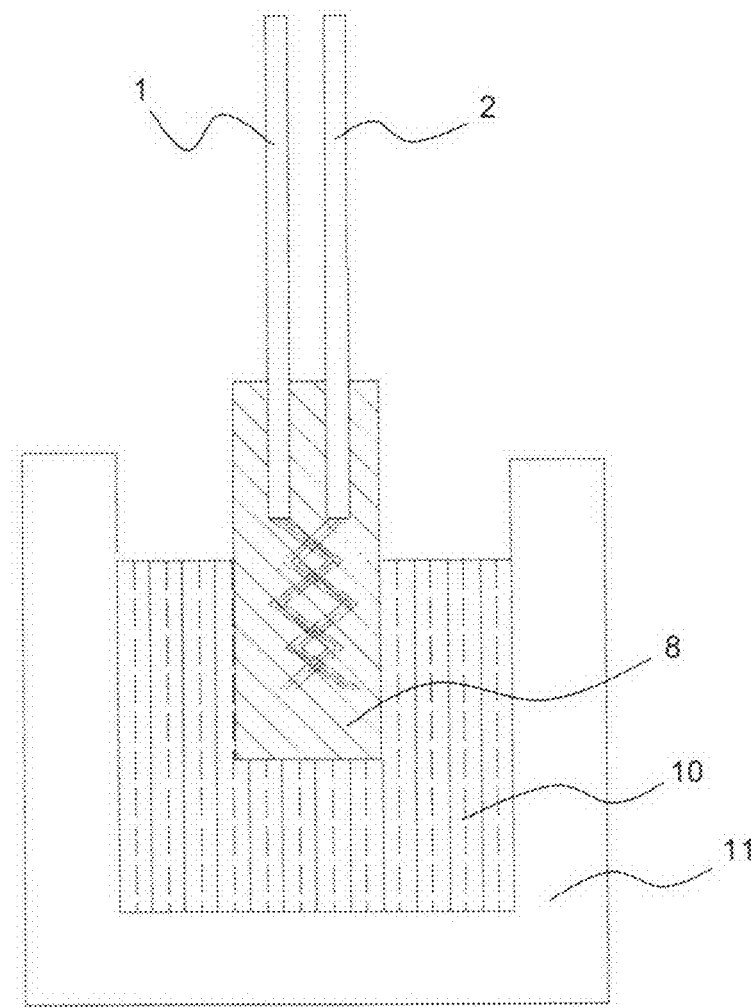
FIG. 5 shows a schematic view of a pot with molten Mg, into which a compressed element is partially immersed for infiltration with molten Mg in accordance with the invention.

FIG. 5 shows another possibility of infiltration of the compressed element 8 with molten magnesium 10 within the scope of the invention. The compressed element 8 is thereby only partially immersed into the molten magnesium 10 in the pot 11. The compressed element 8 may thereby be suspended via the wires 1, 2 (see FIG. 5) or also be supported on the pot bottom (not shown). The molten magnesium 10 may also be provided by heating solid Mg (e.g. in the form of bars) in the pot 11 together with the compressed element 8.

The molten magnesium 10 also infiltrates the regions of the compressed element 8, which are not directly externally surrounded by the molten magnesium 10, due to capillary forces.

Figure 6:
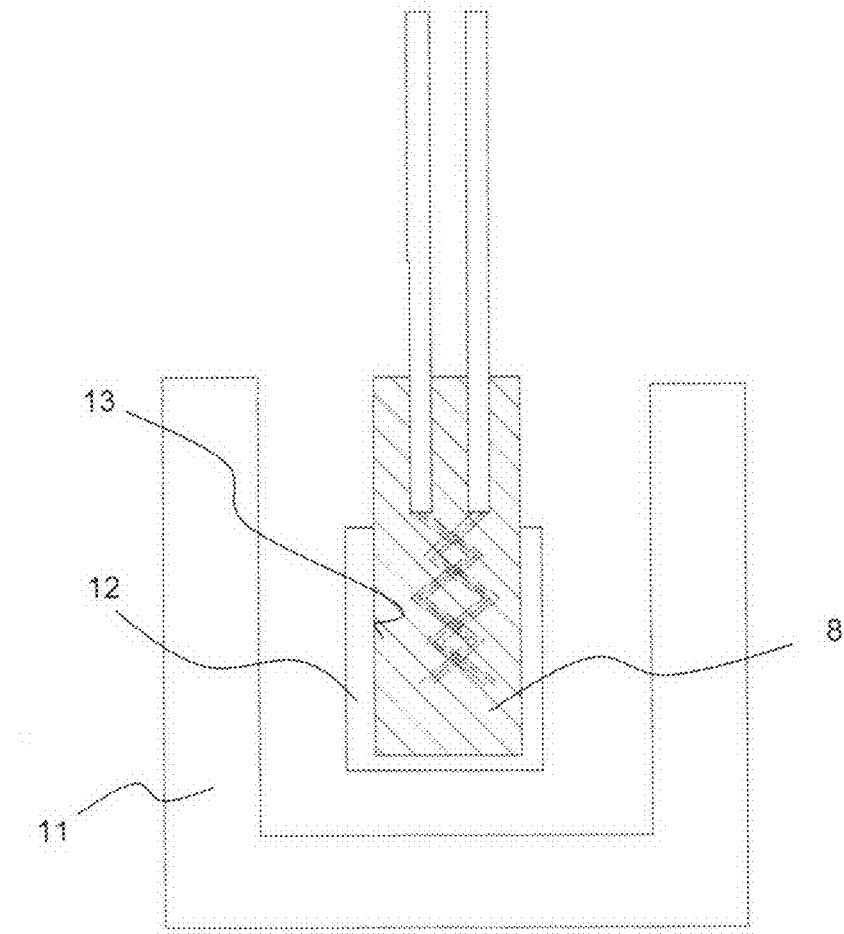
FIG. 6 shows a schematic view of a pot into which a compressed element with solid magnesium coating projects, for heating and thereby infiltrating with molten Mg in accordance with the invention.

FIG. 6 illustrates another possibility of infiltration of the compressed element 8 from the outside by molten magnesium. The compressed element 8 is thereby partially surrounded by a coating 12 of solid magnesium, in the present case an Mg sheet metal. The coating 12 may alternatively e.g. also consist of an Mg foil or a magnesium metal molded part.

The overall coating 12 and compressed element 8 are heated by the melting temperature of the magnesium material of the coating 12. The molten magnesium then penetrates through the surface (outer surfaces) 13 of the compressed element 8 into the compressed element 8 and can react to form $Mg B_2$.

For safety reasons, the overall compressed element 8 and coating 12 are surrounded by a pot 11, in particular, for collecting dropping liquid magnesium.

The overall coating 12 and compressed element 8 may thereby also be supported in the pot 11 (not shown) in order to yield an improved heat input from the normally heated pot into the surroundings 12 and into the compressed element 8.

It should be noted that a pot 11 (cf. FIGS. 4, 5, 6) can also form an enclosed sleeve around the compressed element 8 or also have another shape that is adjusted to the geometry of the joint.

We claim:

1. A method for connecting two or more wires, each wire comprising at least one filament that contains $MgB_2$ or a mixture of Mg and B, wherein a superconducting connection is realized at exposed end regions of the filaments via an $MgB_2$ matrix, the method comprising the steps of:
    a) inserting the exposed end regions of the filaments into bulk boron powder, the bulk boron powder being present in amorphous form;
    b) compacting the bulk boron powder together with the exposed end regions of the filaments following step a) to form a compressed element; and
    c) infiltrating the compressed element with molten magnesium by providing the molten magnesium in a pot and by immersing the compressed element into the molten magnesium, wherein an entire amount of the molten magnesium is introduced at a surface of the compressed element.

2. The method of claim 1, wherein the pot is produced from a material that is inert with respect to liquid magnesium or from a material which comprises Nb, Ta, V, Ti or Fe.

3. The method of claim 1, wherein, in step b), the compressed element is compacted to at least 40% of a theoretical density.

4. The method of claim 1, wherein step c) is performed in a reducing atmosphere, an inert atmosphere or in an argon atmosphere.

5. The method of claim 1, wherein the exposed end regions of different wire filaments are disposed in the bulk powder in such a fashion that they abut each other.

6. The method of claim 1, wherein the exposed end regions of different wire filaments are disposed in the bulk powder in such a fashion that they are interwoven with each other.

7. The method of claim 1, wherein the boron powder has a D50 grain size of ≤1 μm.

8. The method of claim 1, wherein, in step b), the compressed element is compacted to at least 50% of a theoretical density.

9. The method of claim 1, wherein a relative used amount n(Mg) of magnesium in the molten magnesium and n(B) of boron in the compressed element is n(Mg)/n(B)≥0.5.

10. The method of claim 9, wherein pores of the $MgB_2$ matrix of the compressed element are filled with metallic magnesium.

11. A method for connecting two or more wires, each wire comprising at least one filament that contains $MgB_2$ or a mixture of Mg and B, wherein a superconducting connection is realized at exposed end regions of the filaments via an $MgB_2$ matrix the method comprising the steps of:
    a) inserting the exposed end regions of the filaments into bulk boron powder, the bulk boron powder being present in amorphous form;
    b) compacting the bulk boron powder together with the exposed end regions of the filaments following step a) to form a compressed element; and
    c) infiltrating the compressed element with molten magnesium, wherein an entire amount of the molten magnesium is introduced at a surface of the compressed element by disposing the compressed element in a pot and by subsequently filling the pot with molten magnesium.

12. The method of claim 11, wherein the pot is produced from a material that is inert with respect to liquid magnesium or from a material which comprises Nb, Ta, V, Ti or Fe.

13. The method of claim 11, wherein the pot has a coating made from a material which is inert with respect to liquid magnesium or from a material which includes Nb, Ta, V, Ti or Fe.

14. A method for connecting two or more wires, each wire comprising at least one filament that contains $MgB_2$ or a mixture of Mg and B, wherein a superconducting connection is realized at exposed end regions of the filaments via an $MgB_2$ matrix, the method comprising the steps of:
    a) inserting the exposed end regions of the filaments into bulk boron powder, the bulk boron powder being present in amorphous form;
    b) compacting the bulk boron powder together with the exposed end regions of the filaments following step a) to form a compressed element; and
    c) infiltrating the compressed element with molten magnesium, wherein an entire amount of the molten magnesium is introduced at a surface of the compressed element by completely surrounding the compressed element with the molten magnesium.

15. A method for connecting two or more wires, each wire comprising at least one filament that contains $MgB_2$ or a mixture of Mg and B, wherein a superconducting connection is realized at exposed end regions of the filaments via an $MgB_2$ matrix, the method comprising the steps of:
    a) inserting the exposed end regions of the filaments into bulk boron powder, the bulk boron powder being present in amorphous form;
    b) compacting the bulk boron powder together with the exposed end regions of the filaments following step a) to form a compressed element; and
    c) infiltrating the compressed element with molten magnesium, wherein an entire amount of the molten magnesium is introduced at a surface of the compressed element by at least partially surrounding the compressed element with solid magnesium and heating the at least partially surrounded compressed element beyond a melting temperature of magnesium.

* * * * *